United States Patent
Kim et al.

(10) Patent No.: US 10,857,574 B2
(45) Date of Patent: Dec. 8, 2020

(54) MASK CLEANING APPARATUS

(71) Applicant: Samsung Display Co., Ltd., Yongin-si (KR)

(72) Inventors: Myung Kyu Kim, Yongin-si (KR); Kyung Hoon Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 385 days.

(21) Appl. No.: 15/991,305

(22) Filed: May 29, 2018

(65) Prior Publication Data

US 2018/0345332 A1  Dec. 6, 2018

(30) Foreign Application Priority Data

May 30, 2017  (KR) .................. 10-2017-0067056

(51) Int. Cl.
  *B08B 7/00* (2006.01)
  *B08B 15/04* (2006.01)
  *H01L 51/00* (2006.01)

(52) U.S. Cl.
  CPC ............ *B08B 7/0042* (2013.01); *B08B 7/005* (2013.01); *B08B 7/0057* (2013.01); *B08B 15/04* (2013.01); *H01L 51/0011* (2013.01)

(58) Field of Classification Search
  CPC ... B08B 7/0028; B08B 7/0035; B08B 7/0042; B08B 7/005; B08B 7/0057; B08B 1/02; B08B 15/04; B60S 3/04; G03G 21/00; B41M 7/0009; H01L 51/0011; H01L 51/0012; H01L 51/0032
  See application file for complete search history.

(56) References Cited

U.S. PATENT DOCUMENTS

2018/0031962 A1* 2/2018 Chou .................. B08B 3/10
2018/0161825 A1* 6/2018 Son .................. C23C 14/042

FOREIGN PATENT DOCUMENTS

KR  10-1195565  10/2012

\* cited by examiner

*Primary Examiner* — Robert J Scruggs
(74) *Attorney, Agent, or Firm* — H.C. Park & Associates, PLC (57) ABSTRACT

A mask cleaning apparatus includes: a mask holding unit configured to hold a mask; a light source unit configured to irradiate light onto the mask to remove a deposition material accumulated on a surface of the mask; and a material collecting unit configured to collect the deposition material removed from the mask, wherein the material collecting unit includes: a plurality of collecting cases corresponding to kinds of the deposition material; a rotating plate having a suction hole; and a plate driving unit configured to rotate the rotating plate to connect the suction hole to at least one of the collecting cases. Based on the irradiated light, different organic deposition materials may be collected for reuse.

20 Claims, 8 Drawing Sheets

MASK CLEANING APPARATUS

CROSS-REFERENCE TO RELATED APPLICATION

This application claims priority from and the benefit of Korean Patent Application No. 10-2017-0067056, filed on May 30, 2017, which is hereby incorporated by reference for all purposes as if fully set forth herein.

BACKGROUND

Field

Exemplary embodiments relate to a mask cleaning apparatus to facilitate recycling of organic deposition materials.

Discussion of the Background

In general, a deposition process of forming an organic thin film on a substrate is typically performed so as to manufacture organic light emitting display devices. If a deposition material is charged and heated in an evaporation source of a chamber, an evaporated deposition material is deposited on a substrate by passing through a pattern hole of a mask.

The evaporated deposition material is accumulated on not only the substrate but also a surface of the mask, and the thickness of the deposition material increases as the deposition process is repeated. Therefore, periodic cleaning is required to remove the deposition material from the mask.

However, since organic materials used in manufacturing of organic light emitting display devices are very high priced, it would be desirable to have a plan which can effectively collect a deposition material removed from a mask to recycle the deposition material.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a mask cleaning apparatus to facilitate recycling of organic deposition materials.

Additional aspects will be set forth in the detailed description which follows, and, in part, will be apparent from the disclosure, or may be learned by practice of the inventive concepts.

According to exemplary embodiments, there is provided a mask cleaning apparatus including: a mask holding unit configured to hold a mask; a light source unit configured to irradiate light onto the mask to remove a deposition material accumulated on a surface of the mask; and a material collecting unit configured to collect the deposition material removed from the mask, wherein the material collecting unit includes: a plurality of collecting cases corresponding to kinds of the deposition material; a rotating plate having a suction hole; and a plate driving unit configured to rotate the rotating plate to connect the suction hole to at least one of the collecting cases.

The light source unit and the material collecting unit may be integrally combined with each other.

The rotating plate may be coupled to one surface of the light source unit that faces the mask, and further include an aperture that allows light generated from the light source unit to be transmitted therethrough.

A plurality of suction holes may be provided, and the plurality of suction holes may be symmetrically located on the rotating plate about the aperture.

The plate driving unit may rotate the rotating plate to connect the suction hole to any one collecting case corresponding to a kind of the deposition material previously recognized through an identification code of the mask.

The material collecting unit may further include a plurality of collecting lines that connect the suction hole to the collecting cases.

The material collecting unit may further include a suction unit that collects an ambient gas through the suction hole.

The light source unit may include first light source units that irradiate infrared light and second light source units that irradiate ultraviolet light.

The first light source units may be located at outer sides, and the second light source units may be located at a central portion.

The first light source units and the second light source units may be alternately arranged.

The mask cleaning apparatus may further include beam field control plates disposed between the first light source units and the second light source units, to distinguish an irradiation area of the infrared light from an irradiation area of the ultraviolet light.

The mask may include a mask frame and a mask sheet supported by the mask frame. Angles of the beam field control plates may be controlled such that the infrared light is irradiated onto first areas corresponding to the mask frame and the ultraviolet light is irradiated onto a second area corresponding to the mask sheet.

The mask cleaning apparatus may further include a clamping unit configured to clamp the mask and change the position of the clamped mask.

The clamping unit may vertically align the mask to face the light source unit.

The clamping unit may perform a scanning operation to reciprocate such that light from the light source unit is uniformly irradiated onto a surface of the mask when the mask is aligned vertically.

The mask cleaning apparatus may further include an air blowing unit configured to blow a deposition material removed from the mask in the direction of the suction hole.

The mask cleaning apparatus may further include a cooling plate disposed on a rear surface of the mask, which is opposed to the light source unit.

The cooling plate may include: a glass substrate in contact with the rear surface of the mask; a glass tray configured to support the glass substrate; a glass chuck configured to fix the glass tray; and a glass cleaner configured to clean the glass substrate.

The deposition material may include at least one of a plurality of organic materials used in manufacturing of an organic light emitting display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, exemplary embodiments of the present disclosure will be described in detail with reference to the accompanying drawings.

Figure 1A:
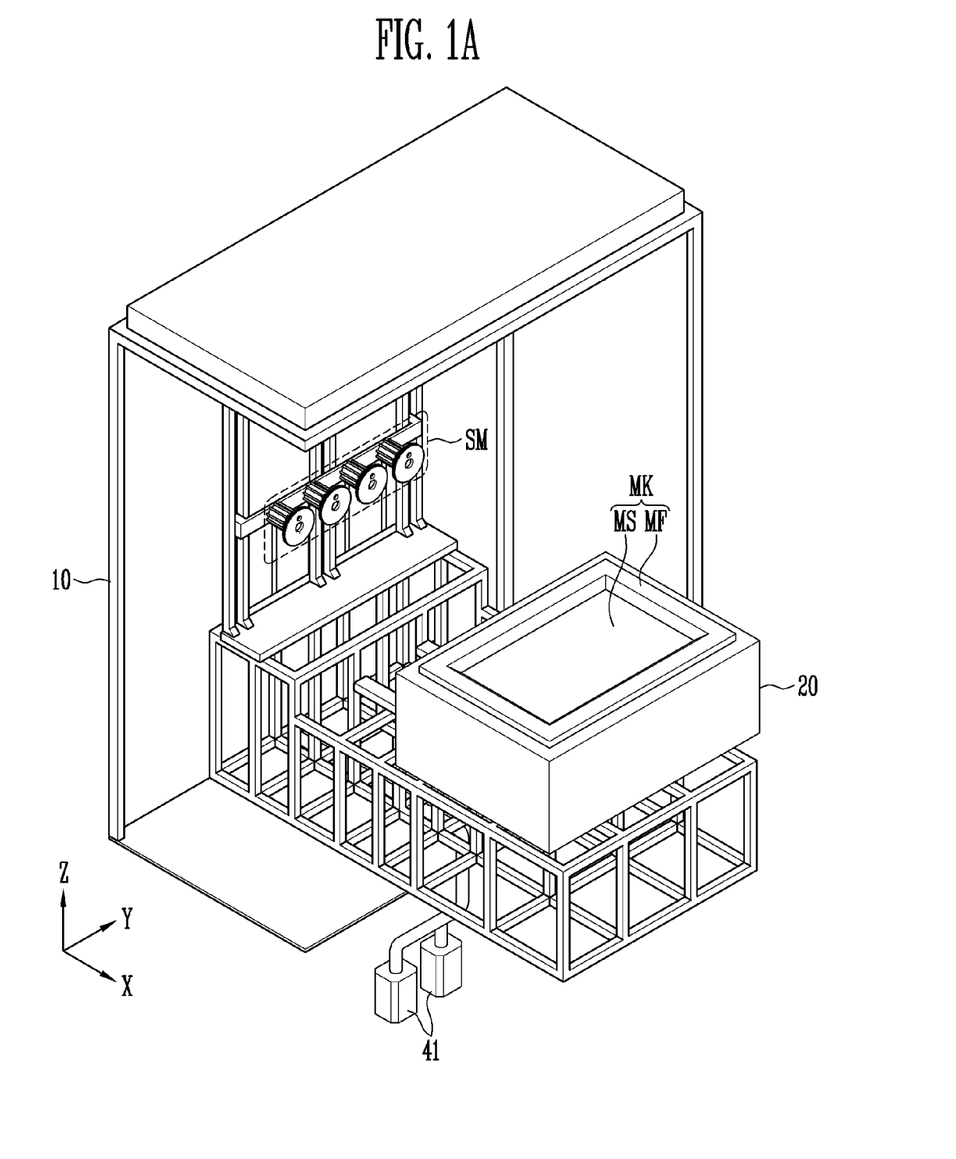
FIG. 1A is a perspective view of a mask cleaning apparatus according to an exemplary embodiment of the present disclosure.
Figure 1B:
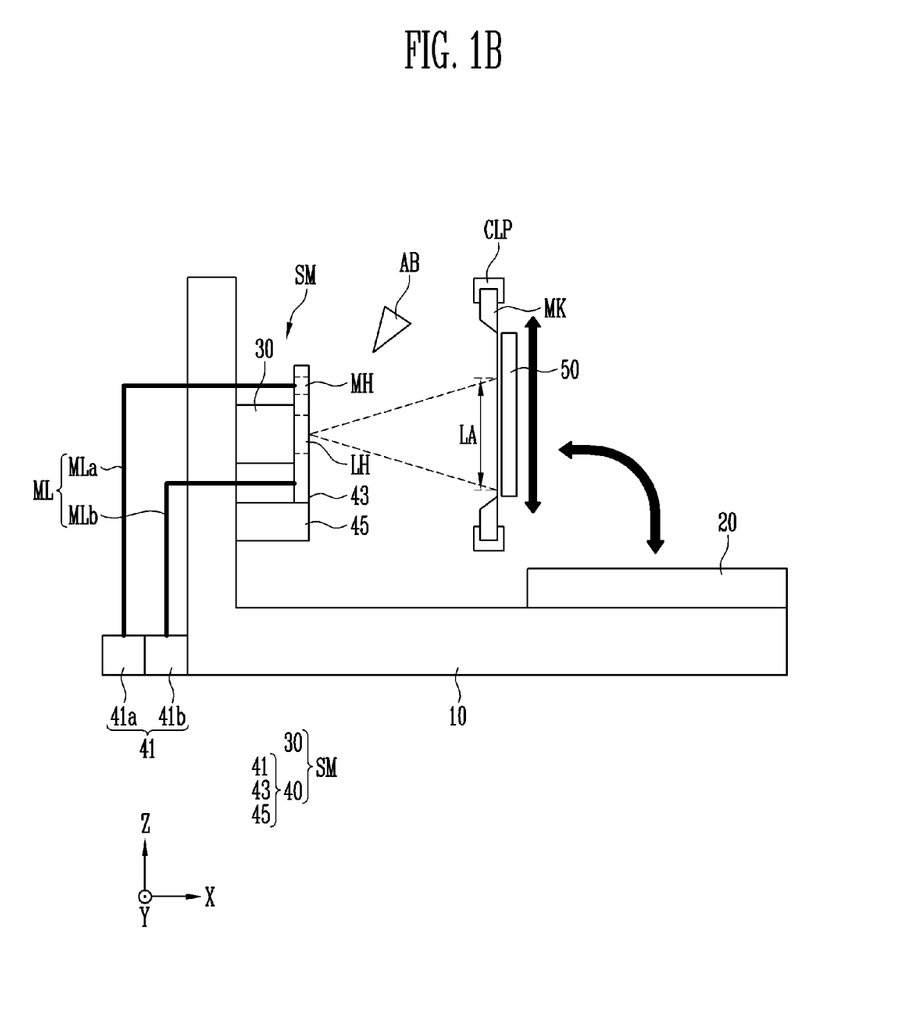
FIG. 1B is a side view schematically illustrating a configuration of the mask cleaning apparatus of FIG. 1A.
Figure 2A:
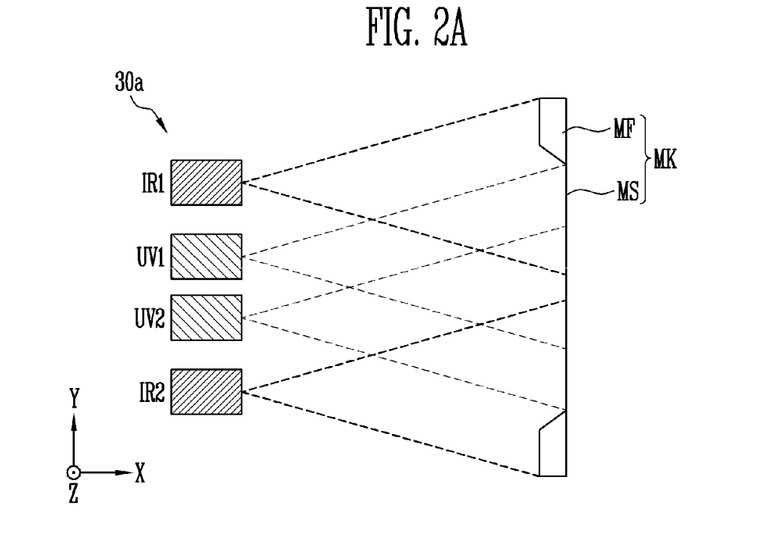
FIGS. 2A and 2B are views illustrating exemplary arrangement embodiments of light source units of FIG. 1B.
Figure 2B:
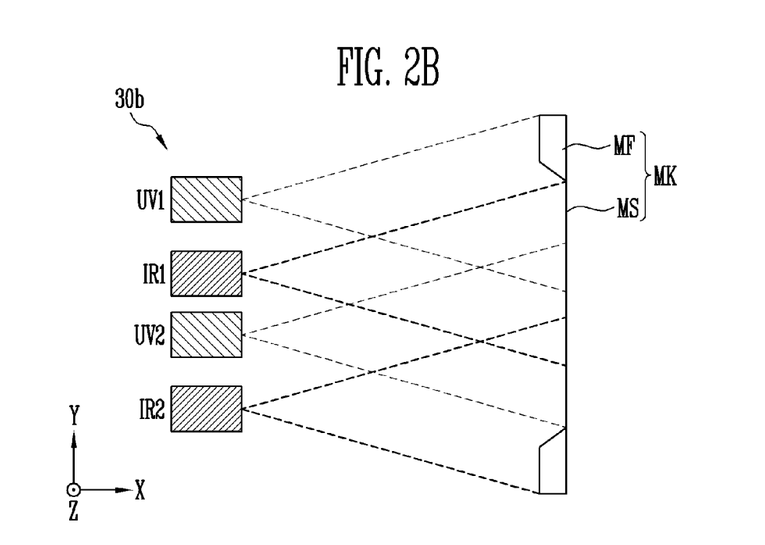

FIG. 1A is a perspective view of a mask cleaning apparatus according to an exemplary embodiment. FIG. 1B is a side view schematically illustrating a configuration of the mask cleaning apparatus of FIG. 1A. FIGS. 2A and 2B are views illustrating arrangement embodiments of light source units of FIG. 1B. Directions are represented through the Cartesian coordinate system, and the Z direction indicates a direction vertical to the ground.

Referring to FIGS. 1A and 1B, the mask cleaning apparatus according to the exemplary embodiment may include a frame unit 10, a mask holding unit 20, a light source unit 30, a material collecting unit 40, and a cooling plate 50.

The frame unit 10 forms an outer frame of the mask cleaning apparatus, and has a space that supports and accommodates the mask holding unit 20, the light source unit 30, the material collecting unit 40, and the cooling plate 50. The components may be coupled to one another by fastening members (not shown) such as bolts/nuts, joints, and/or clamps, or a screw thread coupling between the fastening members or a flange structure, to maintain mechanical coupling strength. The material of a portion or the whole of the frame unit 10 may be selected from any one of metallic materials such as stainless steel, aluminum, titanium, and copper or any combination thereof, but the present disclosure is not limited thereto.

The mask holding unit 20 is fixed to a portion of the frame unit 10 to hold a mask MK. The mask holding unit 20 may be formed in the shape of a rectangular box to hold the mask MK when the mask MK is laid. Although not shown in detail, the mask holding unit 20 may include an aligning device for aligning the mask MK at a normal position, a mask determining device for determining the kind of the mask MK, and a transfer device for transferring the mask MK, e.g., a roll or the like.

The mask MK may include a mask frame MF and a mask sheet MS supported by the mask frame MF. The mask sheet MS may have a plurality of pattern holes (not shown) through which a deposition material passes in a deposition process. The mask MK may be a fine metal mask (FMM) or an open mask. The mask frame MF may be made of a metal, and the mask sheet MS may be made of Invar.

Additionally, the mask cleaning apparatus may further include a clamping unit CLP capable of clamping the mask MK held by the mask holding unit 20 and changing the position of the clamped mask MK. For example, when the mask MK is held on the mask holding unit 20, the clamping unit CLP clamps an edge of the mask MK. Then, the clamping unit CLP lifts the mask MK in a Z direction and rotates the mask MK placed in a horizontal state to be placed in a vertical state.

The clamping unit CLP may align the mask MK to be placed at a position for mask cleaning, i.e., to face the light source unit 30. Then, the clamping unit CLP may perform a scanning operation to reciprocate in the Z direction such that light from the light source unit 30 is uniformly irradiated onto a surface of the mask MK when the mask MK is aligned vertically. The clamping unit CLP may include various mechanical devices for grasping the mask MK and performing a tilt, a rotary motion, and the like.

The light source unit 30 is a component for irradiating light onto the mask MK to remove a deposition material accumulated on the surface of the mask MK. The light may be infrared laser or ultraviolet laser. If the light is irradiated onto the mask MK, the deposition material accumulated on the surface of the mask MK may be removed by heat energy of the light.

The wavelength band, irradiation time, and irradiation area of the light may be previously set to be suitable for the kind of the mask MK, the size of the mask MK, and the kind of the accumulated deposition material. For example, the infrared laser is effective in removing a deposition material accumulated on the mask frame MF, and the ultraviolet laser is effective in removing a deposition material accumulated on the mask sheet MS.

Referring to FIGS. 2A and 2B, a plurality of light source units 30 may be provided, and may be arranged in various manners. In this exemplary embodiment, the light source units 30 includes first light source units IR1 and IR2 that irradiate infrared light and second light source units UV1 and UV2 that irradiate infrared light. The light source units 30 may be arranged linearly in a Y direction.

In an exemplary embodiment, as shown in FIG. 2A, the first light source units IR1 and IR2 and the second light source units UV1 and UV2 may be arranged such that the first light source units IR1 and IR2 are located at outer sides and the second light source units UV1 and UV2 may be located at a central portion. The light source unit 30a of this exemplary embodiment irradiates infrared light onto the mask frame MF and irradiates infrared light onto the mask sheet MS, thereby increasing a cleaning effect.

In another exemplary embodiment, as shown in FIG. 2B, the first light source units IR1 and IR2 and the second light source units UV1 and UV2 may be alternately arranged. The light source unit 30b of this exemplary embodiment can entirely irradiate more uniform light, and correspond to various types of masks.

The material collecting unit 40 is a composition that collects a deposition material removed from the mask MK. The deposition material may include at least one of a plurality of organic materials used in manufacturing of an organic light emitting display device.

The material collecting unit 40 is preferably integrally combined with the light source unit 30 so as to easily collect the deposition material removed from the mask. In this exemplary embodiment, portions of the light source unit 30 and the material collecting unit 40 may be integrally combined with each other, which will be referred to as a scan module SM. However, in another exemplary embodiment, the light source unit 30 and the material collecting unit 40 may be configured to be separated from each other.

The material collecting unit 40 includes a plurality of collecting cases 41 corresponding to kinds of the deposition material, a rotating plate 43 having a suction hole MH, and a plate driving unit 45 that rotates the rotating plate 43 to connect the suction hole MH to at least one of the collecting cases 41. Also, the material collecting unit 40 may further include a plurality of collecting lines ML that connect the suction hole MH to the collecting cases 41.

The plurality of collecting cases 41 may be located at a lower end of the frame unit 10. The collecting cases 41 may include a first collecting case 41a that accommodates a first deposition material therein and a second collecting case 41b that accommodates a second deposition material therein. The first deposition material and the second deposition material are materials different from each other. In addition, the collecting lines ML may include a first collecting line MLa connected to the first collecting case 41a and a second collecting line MLb connected to the second collecting case 41b. However, the numbers, shapes and positions of the collecting cases 41 and the collecting lines ML are illustrative, and may be variously changed.

The rotating plate 43 is coupled to one surface of the light source unit 30 that faces the mask MK, and may further include an aperture LH that allows light generated from the light source unit 30 to be transmitted therethrough. However, in this exemplary embodiment, a case where one suction hole MH is provided is illustrated as an example, but a plurality of suction holes MH may be provided without departing from the scope of the present disclosure.

The plate driving unit 45 rotates the rotating plate 43 to connect the suction hole MH to any one collecting case 41 corresponding to a kind of the deposition material previously recognized through an identification code of the mask MK. For example, if the mask MK is mounted on the mask holding unit 20, a mask recognizing device (not shown) recognizes a bar code of the mask MK. The mask recognizing device recognizes a deposition material accumulated on the mask MK, and transmits data related to the recognized deposition material to the plate driving unit 45.

If it is assumed that the deposition material accumulated on the mask MK is the second deposition material, the plate driving unit 45 rotates the rotating plate 43 to connect the suction hole MH to the second collecting case 41b. Since the second collecting case 41b is connected to the suction hole MH through the second collecting line MLb, the suction hole MH is directly connected to the second collecting line MLb.

Additionally, the mask cleaning apparatus may further include an air blowing unit AB for blowing a deposition material removed from the mask MK during a cleaning operation in the direction of the suction hole MH. A plurality of air blowing units AB may be provided around the mask MK.

The cooling plate 50 is a component for cooling the mask MK heated in the cleaning operation, and may be disposed on a rear surface of the mask MK, which is opposed to the light source unit 30. The cooling plate 50 will be described in detail later with reference to FIGS. 5A and 5B.

Figure 3A:
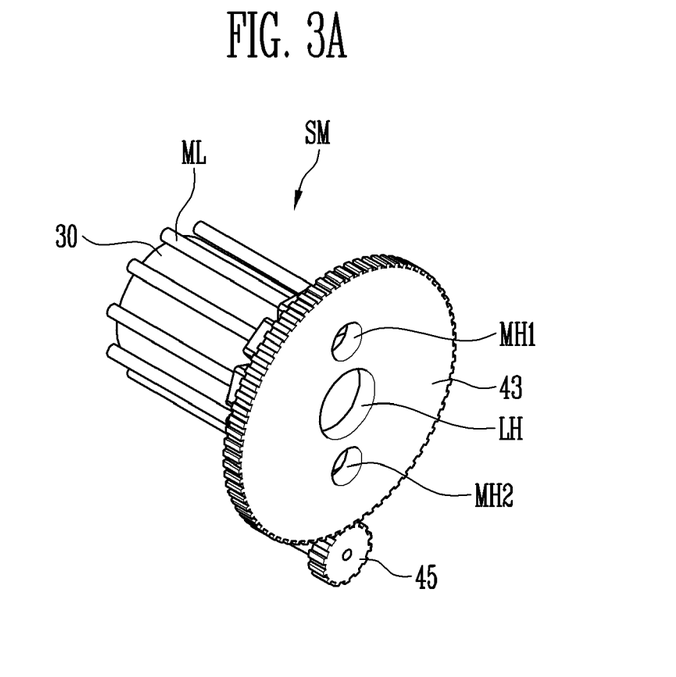
FIG. 3A is an enlarged perspective view illustrating a scan module according to an exemplary embodiment.
Figure 3B:
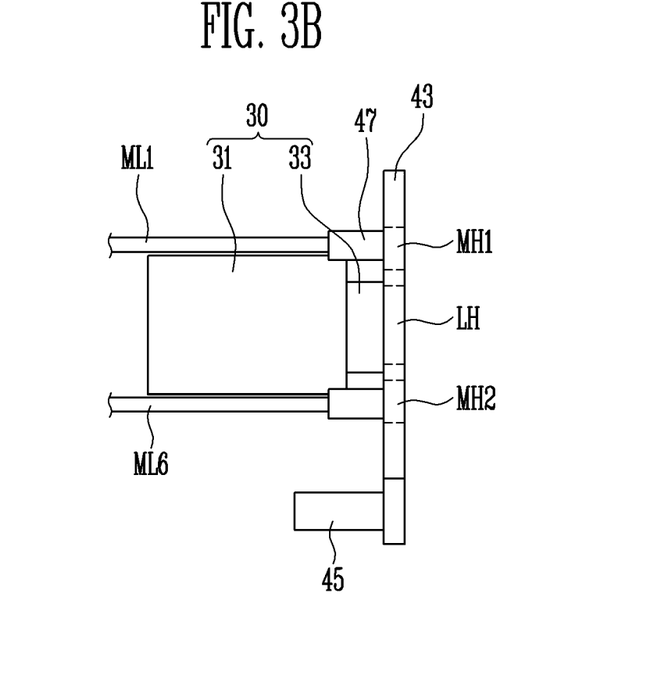
FIG. 3B is a side view of the scan module of FIG. 3A.
Figure 3C:
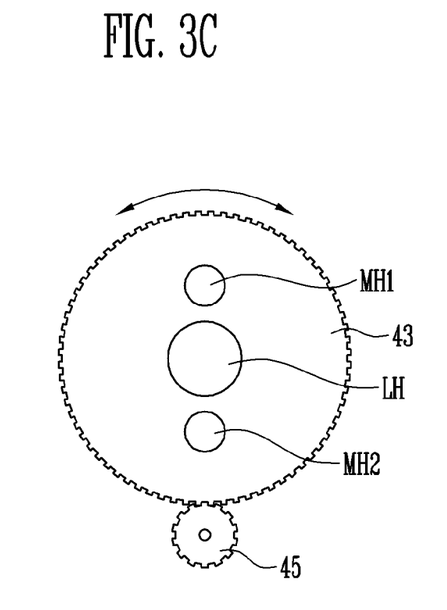
FIG. 3C is a view illustrating a front surface of the scan module of FIG. 3A.
Figure 3D:
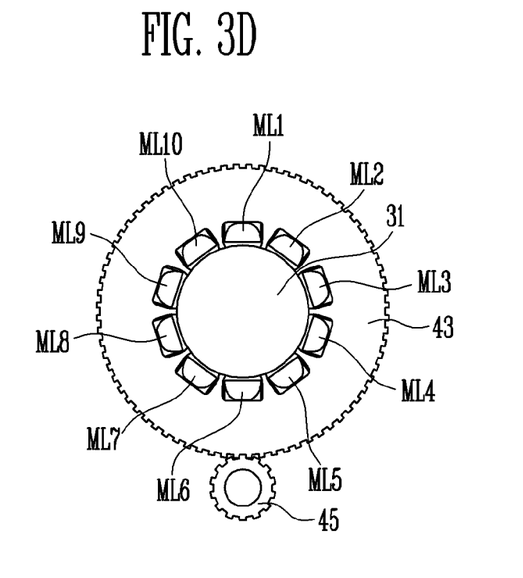
FIG. 3D is a view illustrating a rear surface of the scan module of FIG. 3A.

FIG. 3A is an enlarged perspective view illustrating a scan module according to an exemplary embodiment. FIG. 3B is a side view of the scan module of FIG. 3A. FIG. 3C is a view illustrating a front surface of the scan module of FIG. 3A. FIG. 3D is a view illustrating a rear surface of the scan module of FIG. 3A.

Referring to FIGS. 3A, 3B, 3C, and 3D, the scan module SM according to the exemplary embodiment is a component in which portions of the light source unit 30 and the material collecting unit 40 are integrally coupled to each other. A plurality of scan modules SM may be provided, but the plurality of scan modules SM have the same structure. Therefore, in this exemplary embodiment, one of the plurality of scan modules SM will be described for convenience of illustration. In addition, descriptions of components substantially identical to those of the above-described embodiment will be omitted.

The light source unit 30 may include a body unit 31 that generates light and a lens unit 33 that condenses or scatters the generated light. The body unit 31 may have a cylindrical shape, but the present disclosure is not limited thereto. The lens unit 33 may be installed at one surface of the body unit 31, and may include a focus control device.

As described above, the material collecting unit 40 includes collecting cases 41, a rotating plate 43, and a plate driving unit 45. A plurality of collecting lines ML may be disposed at a certain distance along the circumference of the body unit 31. Although not shown in detail, each of the collecting lines ML has a structure in which the collecting line ML is connected to at least one of the collecting cases 41.

The rotating plate 43 includes an aperture LH located at the center thereof, and a first suction hole MH1 and a second suction hole MH2, which are located around the aperture LH. The first suction hole MH1 and the second suction hole MH2 are symmetrically located on the rotating plate 43 about the aperture LH. As the first suction hole MH1 and the second suction hole MH2 are symmetrically located in directions opposite to each other, the material collecting performance of the material collecting unit 40 can be increased. However, in another exemplary embodiment, three or more suction holes MH may be provided.

In a cleaning operation, the first suction hole MH1 and the second suction hole MH2 simultaneously suck an ambient gas. The first suction hole MH1 and the second suction hole MH2 are connected to any one of the collecting cases 41. For example, it is assumed that five collecting cases 41 are provided to collect five kinds of deposition materials. Also, it is assumed that the collecting lines ML include first to tenth collecting lines ML1 to ML10. The first suction hole MH1 and the second suction hole MH2 collect the same deposition material, and two collecting lines located symmetrically to each other among the collecting lines ML are connected to the same collecting case. Specifically, the first collecting line ML1 and the sixth collecting line ML6 are connected to the same collecting case. In addition, the second collecting line ML2 and the seventh collecting line ML7 are connected to the same collecting case.

Additionally, the material collecting unit 40 may further include a suction unit 47 that sucks an ambient gas through the suction holes MH1 and MH2. The suction unit 47 may be located at a rear surface of the rotating plate 43 to adjacent to the first suction hole MH1 and the second suction hole MH2. The suction unit 47 along with the above-described air blowing unit AB can increase the material collecting performance.

The plate driving unit 45 is a component that rotates the rotating plate 43, and the rotating plate 43 and the plate driving unit 45 may have a structure in which their saw-toothed wheels are geared with each other. The plate driving unit 45 may include a driving motor (not shown) for providing rotary power. However, the rotational structure of the rotating plate 43 and the plate driving unit 45 is not limited to that described above, and may have various modifications.

Figure 4A:
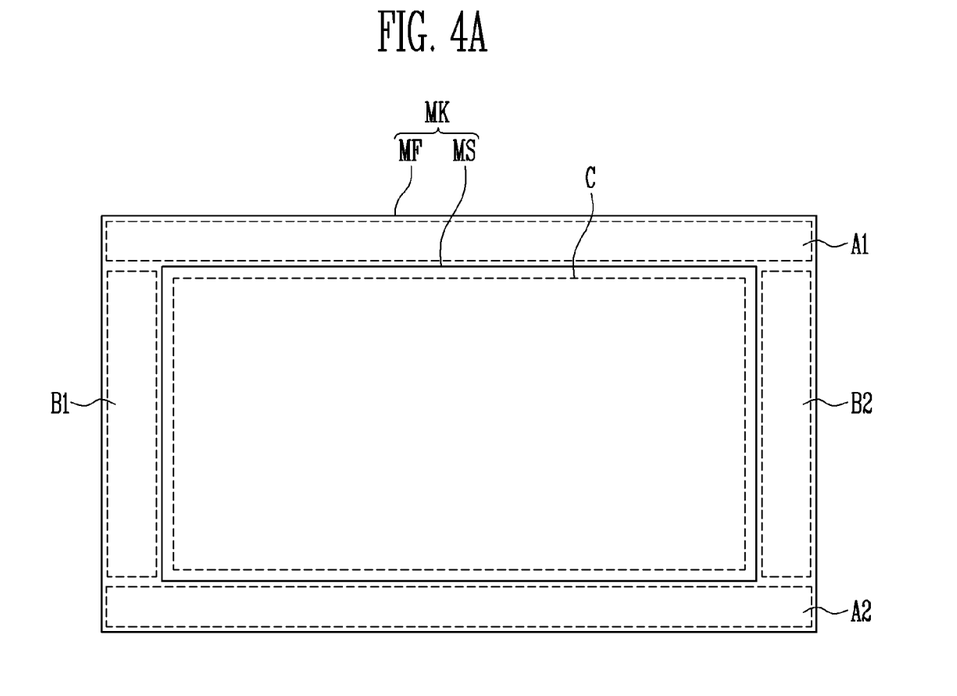
FIG. 4A is a front view illustrating a mask according to an exemplary embodiment.
Figure 4B:
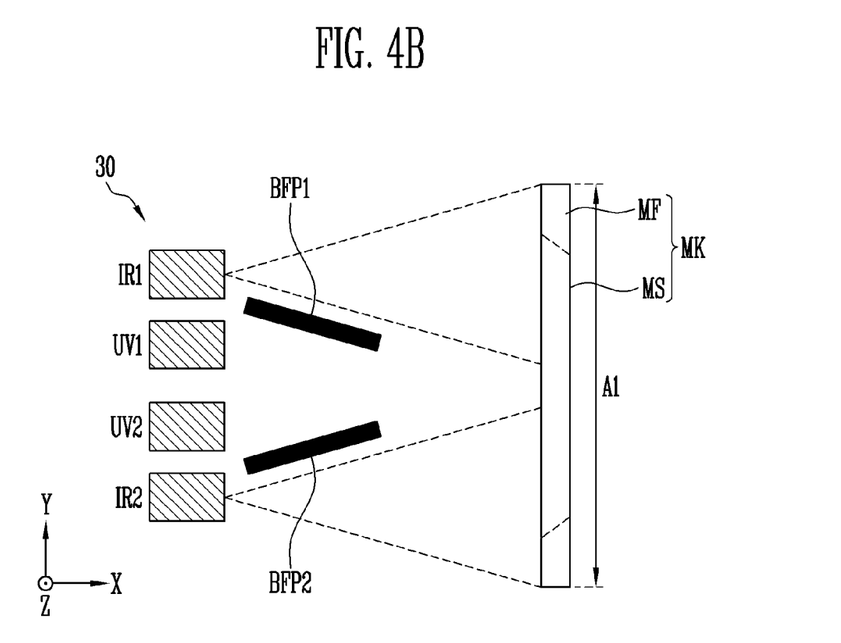
FIGS. 4B and 4C are views illustrating beam field control plates according to an exemplary embodiment.
Figure 4C:
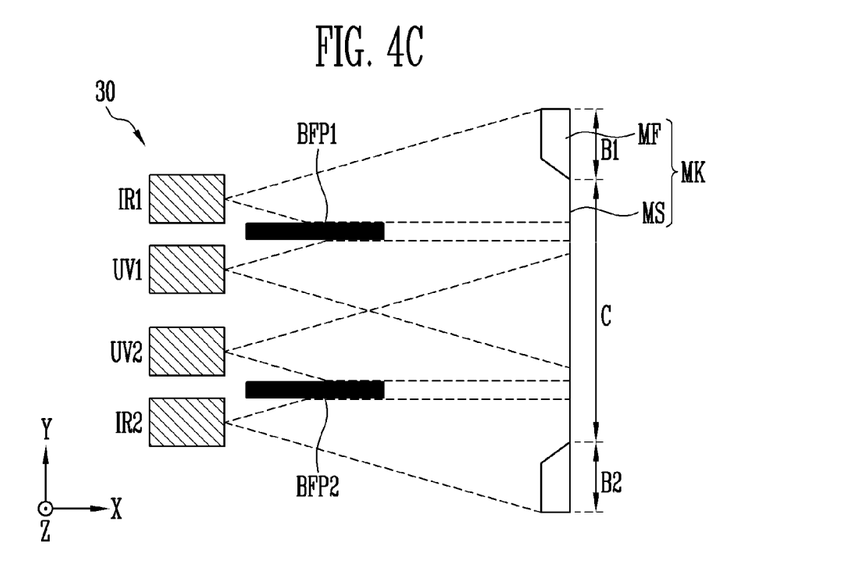

FIG. 4A is a front view illustrating a mask according to an exemplary embodiment. FIGS. 4B and 4C are views illustrating beam field control plates according to an embodiment.

Referring to FIGS. 4A, 4B, and 4C, the mask cleaning apparatus according to the exemplary embodiment may further include beam field control plates BFP1 and BFP2 that are disposed between the first light source units IR1 and IR2 and the second light source units UV1 and UV2, to distinguish an irradiation area of the infrared light from an irradiation area of the ultraviolet light. In this exemplary embodiment, it is assumed that the first light source units IR1 and IR2 that output the infrared light are located at outer sides and the second light source units UV1 and UV2 that output the ultraviolet light are located at a central portion.

In a cleaning operation, inclinations of the beam field control plates BFP1 and BFP2 are controlled according to which area light is irradiated onto. For example, the mask MK may be divided into first areas A1, A2, B1, and B2 corresponding to the mask frame MF and a second area C corresponding to the mask sheet MS. The angle between the beam field control plates BFP1 and BFP2 is controlled such that the infrared light is irradiated onto the first areas A1, A2, B1, and B2 and the ultraviolet light is irradiated onto the second area C, thereby increasing cleaning performance.

As shown in FIG. 4B, when an upper end portion of the mask MK is cleaned, the cleaning area corresponds to A1 of the first areas A1, A2, B1, and B2, and hence the inclinations of the beam field control plates BFP1 and BFP2 are controlled such that the irradiation area of the infrared light is maximized. In this case, the power of the second light source units UV1 and UV2 may be off. In addition, when a lower end portion of the mask MK is cleaned, the cleaning area corresponds to one A2 of the first areas A1, A2, B1, and B2, and hence the inclinations of the beam field control plates BFP1 and BFP2 are controlled such that the irradiation area of the infrared light is maximized.

Referring to FIG. 4C, when a middle portion of the mask MK, the cleansing area includes B1 and B2 of the first areas A1, A2, B1, and B2 and the second area C. Hence, the inclination the beam field control plates BFP1 and BFP2 are controlled such that the infrared light is irradiated onto only the B1 and B2 of the first areas A1, A2, B1, and B2 and the ultraviolet light is irradiated onto the second area C.

Figure 5A:
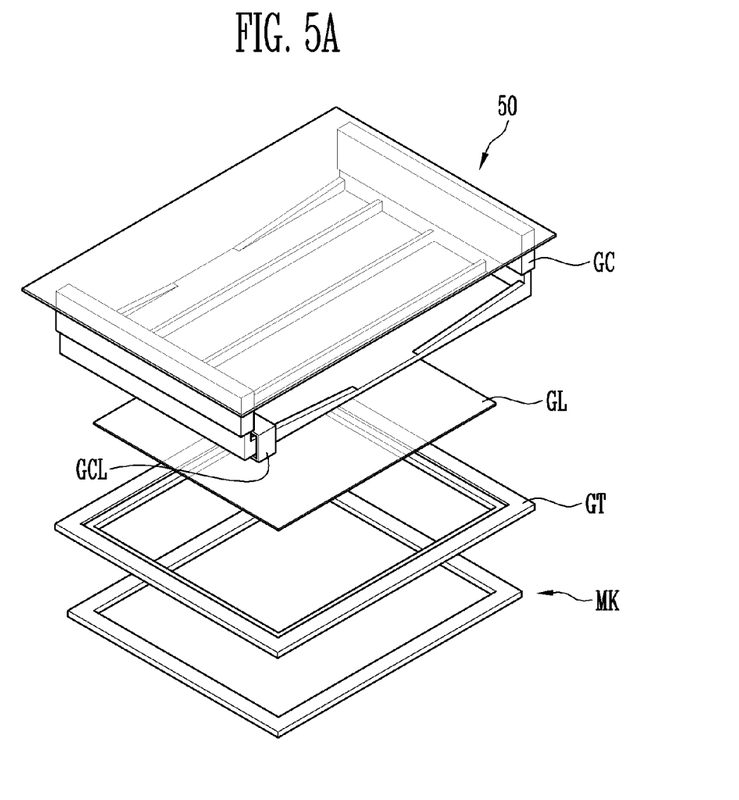
FIG. 5A is an exploded perspective view of a cooling plate according to an exemplary embodiment.
Figure 5B:
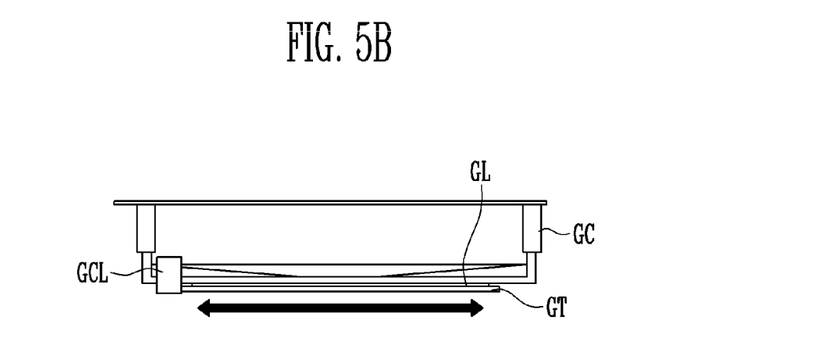
FIG. 5B is a side view of the cooling plate of FIG. 5A.

FIG. 5A is an exploded perspective view of a cooling plate according to an exemplary embodiment. FIG. 5B is a side view of the cooling plate of FIG. 5A.

Referring to FIGS. 5A and 5B, the cooling plate 50 according to the present disclosure may include a glass substrate GL that is in contact with the rear surface of the mask MK, a glass tray GT that supports the glass substrate GL, a glass chuck GC that fixes the glass tray GT, and a glass cleaner GCL for cleaning the glass substrate GL.

The glass substrate GL and the glass tray GT may have a quadrangular shape corresponding to the shape of the mask MK. In a state in which the glass substrate GL is mounted on the glass tray GT, the glass tray GT may be coupled to the glass chuck GC by using a fixing member (not shown) such as a bolt. The glass chuck GC may be configured to allow the glass tray GT coupled thereto to advance or retreat toward the mask MK. The glass cleaner GCL may be configured to clean the glass substrate GL while reciprocating on a surface of the glass substrate GL. In addition, the cooling plate 50 may further include a component that transfer low heat energy to the glass substrate GL.

If light is irradiated in a cleaning operation, a deposition material may be again deposited on the rear surface of the mask MK. In this case, the cooling plate 50 functions to prevent the deposition material from being again deposited on the rear surface of the mask MK. However, the deposition material may be again deposited on the glass substrate GL, and hence the glass cleaner GCL functions to remove the deposition material.

In addition, the cooling plate 50 can minimize deformation and damage of the mask MK, which are caused by heat energy.

According to the present disclosure, in mask cleaning, a deposition material accumulated on a mask is selectively collected according to its kind, so that it is possible to increase the recycle efficiency of the deposition material and reduce cost.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask cleaning apparatus, comprising:
a mask holding unit configured to hold a mask;
a light source unit configured to irradiate light onto the mask to remove a deposition material accumulated on a surface of the mask; and
a material collecting unit configured to collect the deposition material removed from the mask,
wherein the material collecting unit further comprises:
a plurality of collecting cases corresponding to kinds of the deposition material;
a rotating plate comprising a suction hole; and
a plate driving unit configured to rotate the rotating plate to connect the suction hole to at least one of the plurality of collecting cases.

2. The mask cleaning apparatus of claim 1, wherein the light source unit and the material collecting unit are integrally combined with each other.

3. The mask cleaning apparatus of claim 2, wherein the rotating plate is coupled to one surface of the light source unit that faces the mask, and further comprises an aperture that allows light generated from the light source unit to be transmitted therethrough.

4. The mask cleaning apparatus of claim 3, further comprising plurality of suction holes, and the plurality of suction holes are symmetrically located on the rotating plate around the aperture.

5. The mask cleaning apparatus of claim 1, wherein the plate driving unit rotates the rotating plate to connect the suction hole to any one of the plurality of collecting cases corresponding to a kind of the deposition material previously recognized through an identification code of the mask.

6. The mask cleaning apparatus of claim 1, wherein the material collecting unit further comprises a plurality of collecting lines that connect the suction hole to the plurality of collecting cases.

7. The mask cleaning apparatus of claim 1, wherein the material collecting unit further comprises a suction unit that sucks an ambient gas through the suction hole.

8. The mask cleaning apparatus of claim 1, wherein the light source unit further comprises first light source units that irradiate infrared light and second light source units that irradiate ultraviolet light.

9. The mask cleaning apparatus of claim 8, wherein the first light source units are located at outer sides, and the second light source units are located at a central portion.

10. The mask cleaning apparatus of claim 8, wherein the first light source units and the second light source units are alternately arranged.

11. The mask cleaning apparatus of claim 8, further comprising beam field control plates disposed between the first light source units and the second light source units, to distinguish an irradiation area of the infrared light from an irradiation area of the ultraviolet light.

12. The mask cleaning apparatus of claim 11, wherein the mask further comprises a mask frame and a mask sheet supported by the mask frame,
wherein angles of the beam field control plates are controlled such that the infrared light is irradiated onto first areas corresponding to the mask frame and the ultraviolet light is irradiated onto a second area corresponding to the mask sheet.

13. The mask cleaning apparatus of claim 1, further comprising a clamping unit configured to clamp the mask and change a position of the mask.

14. The mask cleaning apparatus of claim 13, wherein the clamping unit vertically aligns the mask to face the light source unit.

15. The mask cleaning apparatus of claim 14, wherein the clamping unit performs a scanning operation to reciprocate such that light from the light source unit is uniformly irradiated onto a surface of the mask when the mask is aligned vertically.

16. The mask cleaning apparatus of claim 1, further comprising an air blowing unit configured to blow a deposition material removed from the mask in a direction of the suction hole.

17. The mask cleaning apparatus of claim 1, further comprising a cooling plate disposed on a rear surface of the mask, which is opposed to the light source unit.

18. The mask cleaning apparatus of claim 17, wherein the cooling plate further comprises:
a glass substrate in contact with the rear surface of the mask;
a glass tray configured to support the glass substrate;
a glass chuck configured to fix the glass tray; and
a glass cleaner configured to clean the glass substrate.

19. The mask cleaning apparatus of claim 1, wherein the deposition material further comprises at least one of a plurality of organic materials used in manufacturing of an organic light emitting display device.

20. The mask cleaning apparatus of claim 1, wherein the light source unit comprises a laser.

* * * * *